(12) United States Patent
Gribok et al.

(10) Patent No.: US 11,467,804 B2
(45) Date of Patent: Oct. 11, 2022

(54) GEOMETRIC SYNTHESIS

(71) Applicant: Intel Corporation

(72) Inventors: Sergey Vladimirovich Gribok, Santa Clara, CA (US); Gregg William Baeckler, San Jose, CA (US); Martin Langhammer, Alderbury (GB)

(73) Assignee: Intel Corporation, Santa Clara, CA (US)

( * ) Notice: Subject to any disclaimer, the term of this patent is extended or adjusted under 35 U.S.C. 154(b) by 577 days.

(21) Appl. No.: 16/457,094

(22) Filed: Jun. 28, 2019

(65) Prior Publication Data

US 2019/0324724 A1 Oct. 24, 2019

Related U.S. Application Data

(60) Provisional application No. 62/814,100, filed on Mar. 5, 2019.

(51) Int. Cl.
*G06F 7/501* (2006.01)
*G06F 17/11* (2006.01)
(Continued)

(52) U.S. Cl.
CPC .............. *G06F 7/501* (2013.01); *G06F 17/11* (2013.01); *G06F 30/34* (2020.01); *G06F 30/36* (2020.01)

(58) Field of Classification Search
CPC .. G06F 7/50–5095; G06F 17/11; G06F 30/34; G06F 30/36
See application file for complete search history.

(56) References Cited

U.S. PATENT DOCUMENTS

| 7,538,579 B1 * | 5/2009 | Schleicher ....... H03K 19/17728 326/41 |
| 7,565,388 B1 * | 7/2009 | Baeckler ................. G06F 7/509 708/235 |

(Continued)

OTHER PUBLICATIONS

B. Khurshid and R. N. Mir, "High Efficiency Generalized Parallel Counters for Xilinx FPGAs," 2015 IEEE 22nd International Conference on High Performance Computing (HiPC), 2015, pp. 40-46, doi: 10.1109/HiPC.2015.41. (Year: 2015).*

(Continued)

*Primary Examiner* — Michelle T Bechtold
*Assistant Examiner* — Carlo Waje
(74) *Attorney, Agent, or Firm* — Fletcher Yoder, P.C.

(57) ABSTRACT

A computer-implemented method for programming an integrated circuit includes receiving a program design and determining one or more addition operations based on the program design. The method also includes performing geometric synthesis based on the one or more addition operations by determining a plurality of bits associated with the one or more addition operations and defining a plurality of counters that includes the plurality of bits. Furthermore, the method includes generating instructions configured to cause circuitry configured to perform the one or more addition operations to be implemented on the integrated circuit based on the plurality of counters. The circuitry includes first adder circuitry configured to add a portion of the plurality of bits and produce a carry-out value. The circuitry also includes second adder circuitry configured to determine a sum of a second portion of the plurality of bits and the carry-out value.

20 Claims, 7 Drawing Sheets

(51) Int. Cl.
*G06F 30/34* (2020.01)
*G06F 30/36* (2020.01)

(56) References Cited

U.S. PATENT DOCUMENTS

| | | | | |
|---|---|---|---|---|
| 7,902,864 | B1* | 3/2011 | Hutton | H03K 19/17736 |
| | | | | 326/39 |
| 8,667,045 | B1* | 3/2014 | Langhammer | H03K 19/17732 |
| | | | | 708/672 |
| 9,337,844 | B1* | 5/2016 | Langhammer | H03K 19/17732 |
| 2009/0216826 | A1* | 8/2009 | Brisk | G06F 7/607 |
| | | | | 708/670 |
| 2010/0153899 | A1* | 6/2010 | McElvain | G06F 30/30 |
| | | | | 716/104 |
| 2011/0153709 | A1* | 6/2011 | Huang | G06F 7/5318 |
| | | | | 708/700 |
| 2016/0246571 | A1* | 8/2016 | Walters, III | G06F 7/575 |

OTHER PUBLICATIONS

Khurshid, B., & Mir, R.N. (2015). High Efficiency Generalized Parallel Counters for Look-Up Table Based FPGAs. Int. J. Reconfigurable Comput., 2015, 518272:1-518272:16. (Year: 2015).*

Y. Yuan et al., "Area Optimized Synthesis of Compressor Trees on Xilinx FPGAs Using Generalized Parallel Counters," in IEEE Access, vol. 7, pp. 134815-134827, 2019, doi: 10.1109/ACCESS. 2019.2941985. (Year: 2019).*

Hadi Parandeh-Afshar et al.; Efficient Synthesis of Compressor Trees on FGPAs; 2008 Asia and South Pacific Design Automation Conference, 2008; pp. 138-143.

Extended European Search Report for EP 20155551.3 dated Jul. 16, 2020, 8 pages.

Hadi Parandeh-Afshar, et al., "Exploiting fast carry-chains of FPGAs for designing compressor trees," Field Programmable Logic and Applications, 2009, FPL 2009, International Conference on, IEEE, Piscataway, NJ, USA, Aug. 31, 2009, pp. 242-249.

Martin Kumm et al., "Efficient High Speed Compression Trees on Xilinx FPGAs," Jan. 1, 2014, retrieved from https://www.uni-kassel.de/eecs/fileadmin/datas/fb16/Fachgebiete/Digitaltechnik/preprints/2014_MBMV_Kumm.pdf on Jun. 26, 2020.

Hadi Parandeh-Afshar, et al., "Efficient Synthesis of Compressor Trees on FPGAs," Design Automation Conference 2008, ASPDAC 2008, Asia and South Pacific, IEEE, Piscataway, NJ, USA, Mar. 21, 2008, pp. 138-143.

* cited by examiner

GEOMETRIC SYNTHESIS

CROSS REFERENCE TO RELATED APPLICATIONS

This application claims priority from and benefit of U.S. Provisional Application Ser. No. 62/814,100, filed Mar. 5, 2019, entitled "Geometric Synthesis," which is hereby incorporated by reference in its entirety for all purposes.

BACKGROUND

This disclosure generally relates to integrated circuits, such as field-programmable gate arrays (FPGAs). More particularly, the present disclosure relates to performing addition implemented using circuitry elements of an integrated circuit (e.g., programmable logic of an FPGA).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Integrated circuits increasingly carry out functions such as encryption and machine leaning. Encryption and machine learning, as well as many other operations that may take place on integrated circuitry, may utilize adder circuitry (e.g., adders). For example, adder trees may be programmed onto logic of an integrated circuit and utilized to determine sums of numbers being added. However, adder trees (e.g., binary adder trees) may not utilize portions of programmable logic while also leaving the programmable logic unavailable to be used for other purposes. Additionally, some adder tress may also utilize undesirable amounts of circuitry (e.g., routing circuitry), which may result in high or increased latency.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
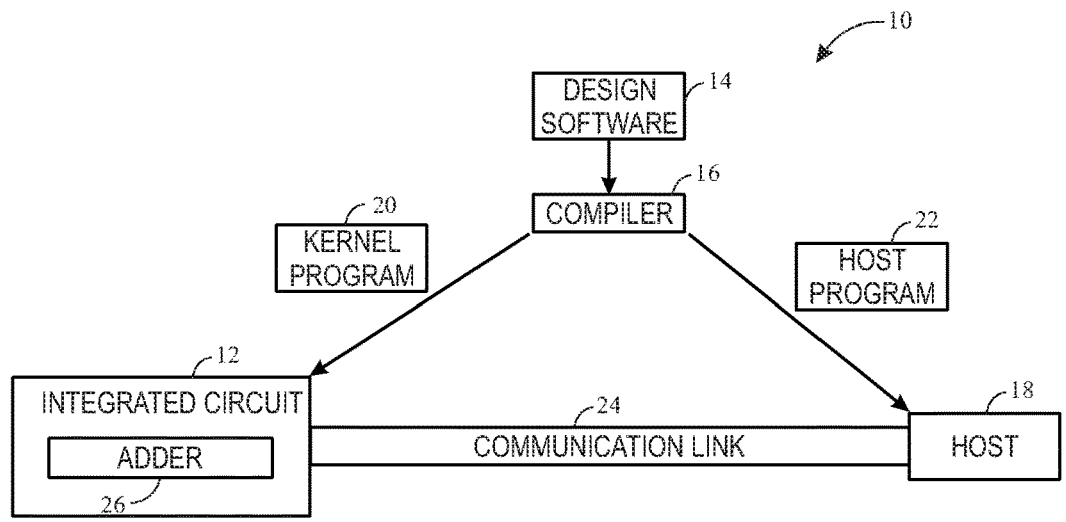
FIG. 1 is a block diagram of a system for implementing arithmetic operations, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

Integrated circuits, such as programmable logic devices, may be utilized to perform mathematical operations, such as addition. For example, logic (e.g., reconfigurable logic) on programmable logic devices can be programmed to perform the mathematical operations. For instance, programmed logic utilized to perform addition can be referred to as an "adder." Adder trees, or adders with outputs that are used as inputs into other adders may be utilized to perform addition. In some cases, adder tress may inefficiently utilize logic and/or other circuitry of the programmable logic device. For instance, adder tress such as binary reduction trees may not fully utilize routing circuitry included on a programmable logic device. Moreover, much of the logic of the programmable logic device may be unused (e.g., not programmed and unavailable to be programmed). The present application is generally directed to more efficient techniques for performing addition on programmable logic devices such as, but not limited to, field programmable gate arrays (FPGAs). For example, as discussed below, counters, such as geometric shapes or representations, may be determined for bits that are to be added, and adding circuitry corresponding to the counters may be used to add the bits. In some cases, the counters may form groups of counters (e.g., interlacing patterns of counters), and the corresponding adding circuitry for the group of counters may include adders that are chained together. Because the adders are chained together, adders may receive carry-out values from other adders within the adding circuitry and add the carry-out values with other bits. Accordingly, the techniques described herein may result in adders that are more densely packed within programmable logic and more efficiently utilize routing circuitry of programmable logic devices. As such, the adder circuitry discussed herein may reduce the area of programmable logic devices utilized to perform addition, increase the amount of logic available for programming (e.g., to perform more addition or another function), and reduce the amount of routing circuitry utilized.

With the foregoing in mind, FIG. 1 illustrates a block diagram of a system 10 that may implement arithmetic operations. A designer may desire to implement functionality, such as the arithmetic operations of this disclosure, on an integrated circuit device 12 (e.g., a programmable logic device such as a field-programmable gate array (FPGA) or an application-specific integrated circuit (ASIC)). In some cases, the designer may specify a high-level program to be implemented, such as an OpenCL program, which may enable the designer to more efficiently and easily provide programming instructions to configure a set of programmable logic cells for the integrated circuit device 12 without specific knowledge of low-level hardware description languages (e.g., Verilog or VHDL). For example, because OpenCL is quite similar to other high-level programming languages, such as C++, designers of programmable logic familiar with such programming languages may have a reduced learning curve than designers that are required to learn unfamiliar low-level hardware description languages to implement new functionalities in the integrated circuit device 12.

The designers may implement their high-level designs using design software 14, such as a version of Intel® Quartus® by INTEL CORPORATION. The design software 14 may use a compiler 16 to convert the high-level program into a lower-level description. The compiler 16 may provide machine-readable instructions representative of the high-level program to a host 18 and the integrated circuit device 12. The host 18 may receive a host program 22 which may be implemented by the kernel programs 20. To implement the host program 22, the host 18 may communicate instructions from the host program 22 to the integrated circuit device 12 via a communications link 24, which may be, for example, direct memory access (DMA) communications or peripheral component interconnect express (PCIe) communications. In some embodiments, the kernel programs 20 and the host 18 may enable configuration of an adder 26 on the integrated circuit device 12. The adder 26 may include circuitry and/or other logic elements and may be configured to implement arithmetic operations, such as addition.

While the techniques described herein relate to the application of a high-level program, in some embodiments, the designer may use the design software 14 to generate and/or to specify a low-level program, such as the low-level hardware description languages described above. Further, in some embodiments, the system 10 may be implemented without a separate host program 22. Moreover, in some embodiments, the techniques described herein may be implemented in circuitry as a non-programmable circuit design. Thus, embodiments described herein are intended to be illustrative and not limiting.

Figure 2:
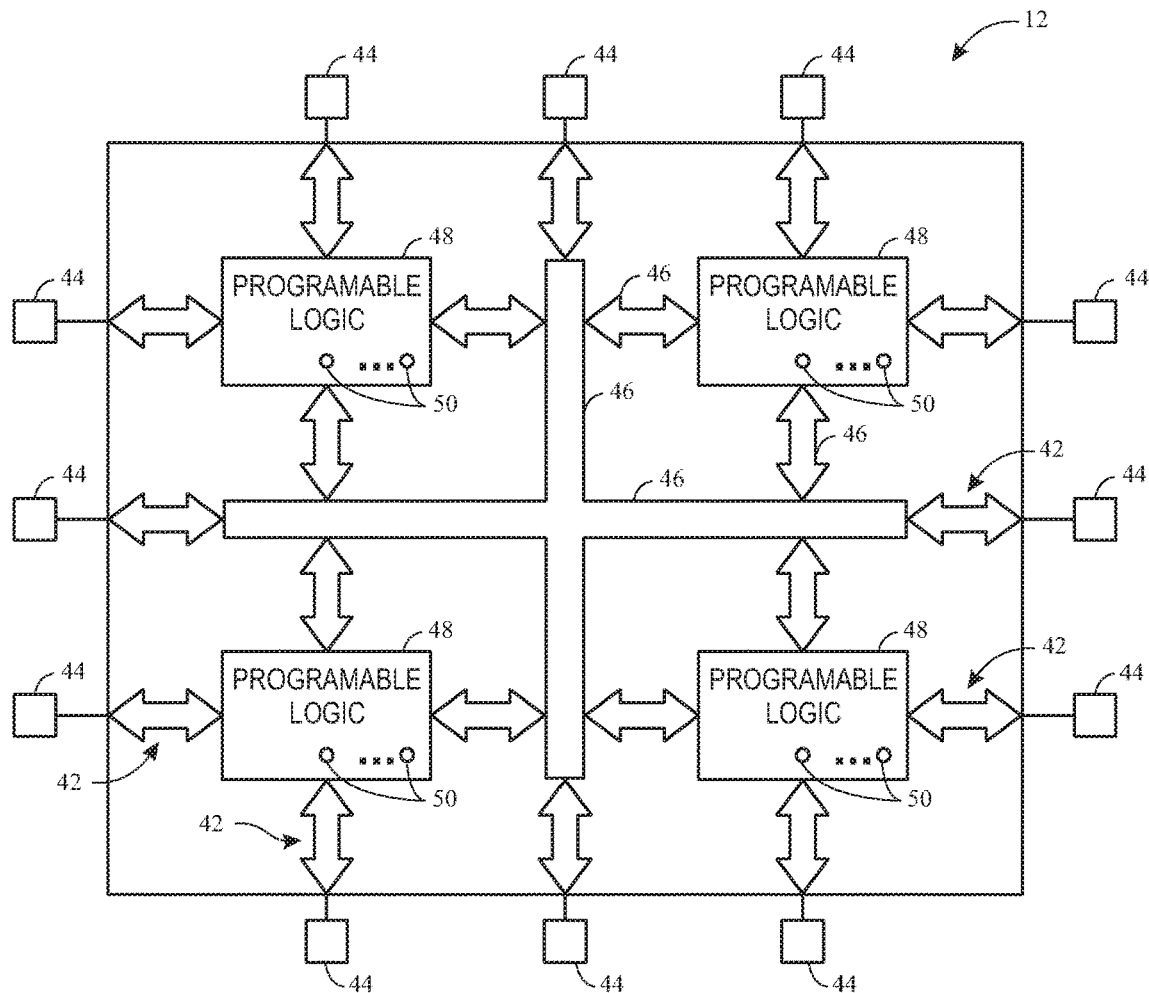
FIG. 2 is a block diagram of an integrated circuit in which addition circuitry may be implemented, in accordance with an embodiment.

Turning now to a more detailed discussion of the integrated circuit device 12, FIG. 2 illustrates an example of the integrated circuit device 12 as a programmable logic device, such as a field-programmable gate array (FPGA). Further, it should be understood that the integrated circuit device 12 may be any other suitable type of programmable logic device (e.g., an ASIC and/or application-specific standard product). As shown, integrated circuit device 12 may have input/output circuitry 42 for driving signals off device and for receiving signals from other devices via input/output pins 44. Interconnection resources 46, such as global and local vertical and horizontal conductive lines and buses, may be used to route signals on integrated circuit device 12. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48.

Programmable logic devices, such as the integrated circuit device 12, may contain programmable elements 50 with the programmable logic 48. For example, as discussed above, a designer (e.g., a customer) may program (e.g., configure) the programmable logic 48 to perform one or more desired functions. By way of example, some programmable logic devices may be programmed by configuring their programmable elements 50 using mask programming arrangements, which is performed during semiconductor manufacturing. Other programmable logic devices are configured after semiconductor fabrication operations have been completed, such as by using electrical programming or laser programming to program their programmable elements 50. In general, programmable elements 50 may be based on any suitable programmable technology, such as fuses, antifuses, electrically-programmable read-only-memory technology, random-access memory cells, mask-programmed elements, and so forth.

Many programmable logic devices are electrically programmed. With electrical programming arrangements, the programmable elements 50 may be formed from one or more memory cells. For example, during programming, configuration data is loaded into the memory cells using pins 44 and input/output circuitry 42. In one embodiment, the memory cells may be implemented as random-access-memory (RAM) cells. The use of memory cells based on RAM technology is described herein is intended to be only one example. Further, because these RAM cells are loaded with configuration data during programming, they are sometimes referred to as configuration RAM cells (CRAM). These memory cells may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

Figure 3:
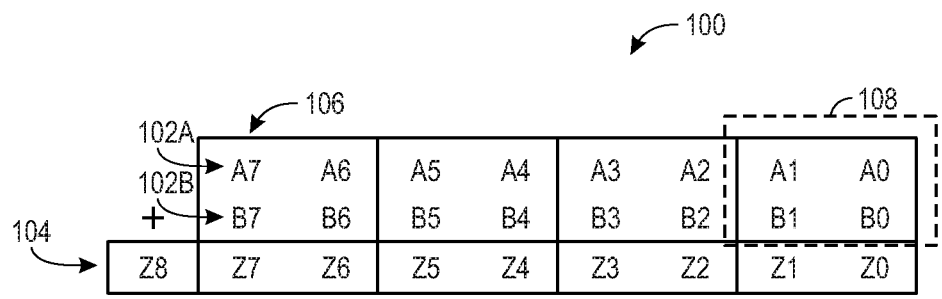
FIG. 3 is a diagram of geometric blocks associated with an addition operation, in accordance with an embodiment.

Keeping the discussion of FIG. 1 and FIG. 2 in mind, a user (e.g., designer) may utilize the design software 14 to implement the adder circuitry (e.g., adder 26) on the programmable logic 48 of the integrated circuit device 12. In particular, the designer may specify in a high-level program that addition be performed. The compiler 16 may convert the high-level program into a lower-level description that is used to program the programmable logic 48 to perform addition. In particular, the compiler 16 may determine counters (e.g., geometric blocks, shapes, or representations) that describe arithmetic to be performed, and the programmable logic 48 may be programmed based on the geometric blocks. With this in mind, FIG. 3 illustrates a diagram 100 that provides an example of counters that may be utilized when performing addition. More specifically, the diagram 100 is indicative of two vectors 102A, 102B being added together, resulting in a sum 104. In particular, values of the vectors 102A, 102B included in columns (e.g., column 106) may be binary values (e.g., "0" or "1") that are added together to produce a corresponding portion of the sum 104 (e.g., Z7 in column 106).

Figure 4:
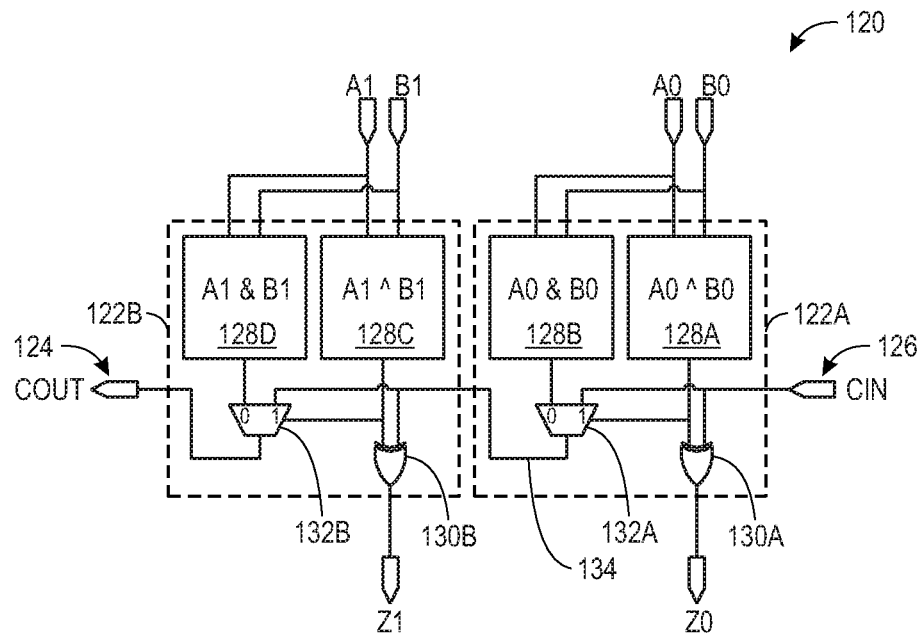
FIG. 4 is a schematic diagram of adder circuity that may be used to determine a portion of the sum of FIG. 3, in accordance with an embodiment.

Portions of the vectors 102A, 102B may be reduced to counters, such as a tetromino 108 that may include four bits that are located orthogonally to at least one other bit. Adder circuitry (e.g., adder 26) may be programmed onto the integrated circuit and utilized to add the values of the tetromino 108. For example, FIG. 4 is a schematic diagram of adder circuitry 120 that may be implemented using the programmable logic 48 of the integrated circuit device 12 and utilized to add the values of the tetromino 108. In particular, the adder circuitry 120 may be described as a ripple-carry adder that includes adders 122A, 122B that each determine the sum of two bits and output a value (e.g., a carry-out value 124 (COUT)) that may be received and utilized as an input (e.g., a carry-in value 126 (CIN)) of another adder 122. In particular, the adders 122A, 122B may be look-up tables (LUTs) that include other look-up tables 128 that may be perform logic operations. For instance, the LUTs 128A, 128C may perform an exclusive or (XOR) logic operation on the input bits (e.g., A0 and B0 for LUT 128A) and provide an output to a respective XOR gate 130. Each XOR gate 130 may receive the output of a LUT 128A, 128C and a carry-in value (e.g., CIN 126) as inputs and produce an output value (e.g., Z0, Z1). The LUTs 128B, 128D may perform an and (AND) logic operation on the input bits (e.g., A0 and B0 for LUT 128B) and provide an output to a respective multiplexer 132. The multiplexers 132 may receive a carry-in value (e.g., CIN 126 for multiplexer 132A and output of multiplexer 132A for multiplexer 132B), the output of a LUT 128A, 128C and the output of a LUT 128B, 128D as inputs and product to produce a carry-out value. For example, a carry-out value from the multiplexer 132A may be provided via a carry chain 134 to the XOR gate 130B and the multiplexer 132B and utilized as a carry-in value.

The adders 122A, 122B may be referred to as "binary adders," which indicates that the adders 122A, 122B may each receive two inputs (e.g., two bits as inputs). Utilizing binary adders such as the adders 122A, 122B may cause portions of the programmable logic 48 to be unutilized as well as unusable. That is, some of the programmable logic 48 may not be able to be programmed to perform operations. For example, in situations where more than two vectors are added, the sums from multiple adder circuits (e.g., several of the adder circuitry 120) may have to be summed by additional adder circuitry. In other words, adder trees that cause portions of the programmable logic 48 to be unutilized as well as unusable may be utilized. As discussed below, counters other than tetrominoes may be utilized, which may cause different numbers of bits to be used as inputs.

Figure 5:
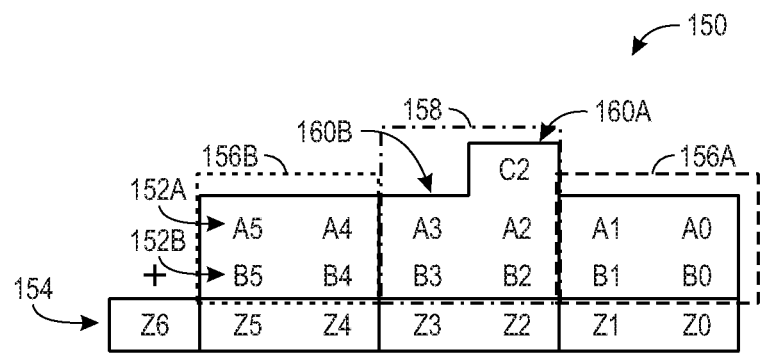
FIG. 5 is a diagram of geometric blocks associated with another addition operation, in accordance with an embodiment.

Continuing with the drawings, FIG. 5 illustrates a diagram 150 showing the addition of vectors 152A, 152B to produce a sum 154. The bits of the vectors 152A, 152B (e.g., A0, B0) may be arranged into different counters, such as tetrominoes 156A, 156B and a pentomino 158. As illustrated, the pentomino 158 includes columns 160 of bits in which one column 160A includes three bits and another column 160B includes two bits. That is, the pentomino 158 includes five bits, each of which is located orthogonally to at least one other bit in the pentomino 158. Bearing this in mind, circuitry that may be programmed onto the integrated circuit device 12 to determine the sum 154 will be discussed.

Figure 6:
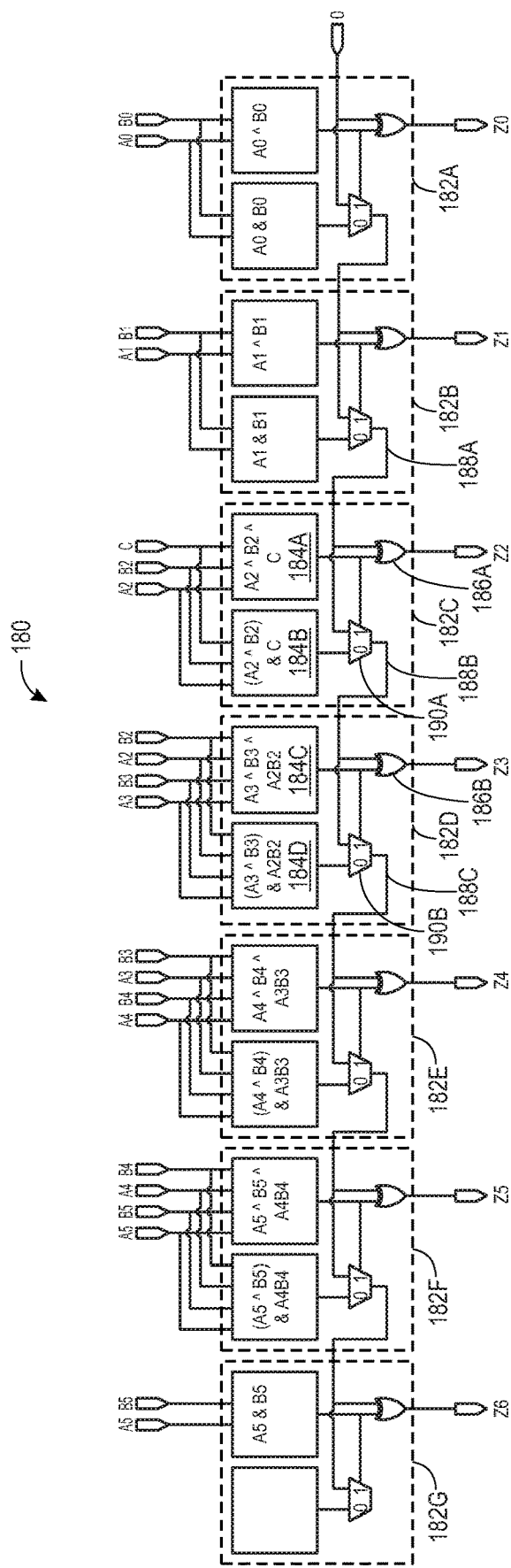
FIG. 6 is a schematic diagram of adder circuitry that may be used to determine the sum of FIG. 5, in accordance with an embodiment.

FIG. 6 is a schematic diagram of adder circuitry 180, which may be included in the adder 26. In particular, the adder circuitry 180 may be utilized to perform the addition operation represented by the diagram 150. As illustrated, the adder circuitry 180 includes several adders 182. Adders 182A, 182B which correspond to tetromino 156A of FIG. 5, may function similarly to the adders 122A, 122B discussed above with respect to FIG. 4.

The adders 182 may be utilized to perform the addition operations associated with the pentomino 158 and the tetromino 156B of FIG. 5. In particular, adder 182C may receive an input of three bits (e.g., A2, B2, C). The adder 182C may include a LUT 184A that performs one or more XOR logic operations on the three bits. For example, the LUT 184A may perform an XOR logic operation on two of the bits (e.g., A2 and B2) to produce an output, and the LUT 184A may perform a subsequent XOR logic operation using the third bit (e.g., C) and the output of the first XOR logic operation as inputs in order to generate an output that is provided to an XOR gate 186A. The XOR gate 186A may produce an output (e.g., Z2) based on the output of the LUT 184A and a carry-in value received from the adder 182B (e.g., via carry chain 188A).

The adder 182C also includes a LUT 184B that may perform an XOR logic operation on two bits (e.g., A2 and B2) to produce an output, and the LUT 184B may perform a subsequent AND logic operation using the third bit (e.g., C) and the output of the XOR logic operation as inputs to generate another output that is provided to a multiplexer 190A. The multiplexer 190A also receive a carry-in value (e.g., from the adder 182B) and the output of the LUT 184A and produce an output that is provided as a carry-out value that can be provided to the next adder 182 in the adder circuitry 180, adder 182D. For example, the carry-out value may be provided via carry chain 188B.

The adder 182D may be utilized to determine the sum of the values of column 160B of the pentomino 158 of FIG. 5. In particular, the adder 182D may receive four inputs, which include the two bits in the column 160B (i.e., A3 and B3) and the two bits of the previous column 160A that are included in the vectors 152A, 152B (i.e., A2 and B2). As illustrated, the adder 182D includes a LUT 184C that may perform several XOR operations. For example, the LUT 184C may perform an XOR logic operation on two bits (e.g., A3 and B3) to produce an output, and the LUT 184C may perform an XOR logic operation using the output and an output of a logic operation involving the two other bits (e.g., an AND logic operation of bits A2 and B2) in order to generate an output that is provided the XOR gate 186B. The XOR gate 186B may produce an output (e.g., Z3) based on the output of the LUT 18CA and a carry-in value received from the adder 182C (e.g., via carry chain 188B).

The adder 182D also includes a LUT 184D that may perform an XOR logic operation on two bits (e.g., A3 and B3) to produce an output, and the LUT 184B may perform a subsequent AND logic operation using output of the XOR logic operation and an output of another logic operation (e.g., an AND logic operation on B2 and C2) as inputs to generate another output that is provided to a multiplexer 190B. The multiplexer 190B also receive a carry-in value (e.g., from the adder 182C) and the output of the LUT 184C and produce an output that is provided as a carry-out value that can be provided to the next adder 182 in the adder circuitry 180, adder 182E. For example, the carry-out value may be provided via carry chain 188C.

As illustrated, adders 182E, 182F function similarly to adder 182D, and adder 182G may be used to process the last two bits in the vectors 152A, 152B that are summed. Accordingly, by using carry chains, which may correspond to a particular wire in the integrated circuit device 12, more than two bits may be added. That is, the carry chains may be utilized in order to account for addition involving an "extra" bit (e.g., bit C). Moreover, adder circuitry, such as the adder circuitry 180, may include adders that receive more than two bits as inputs. With this in mind, a different pentomino that may be utilized will now be discussed.

Figure 7:
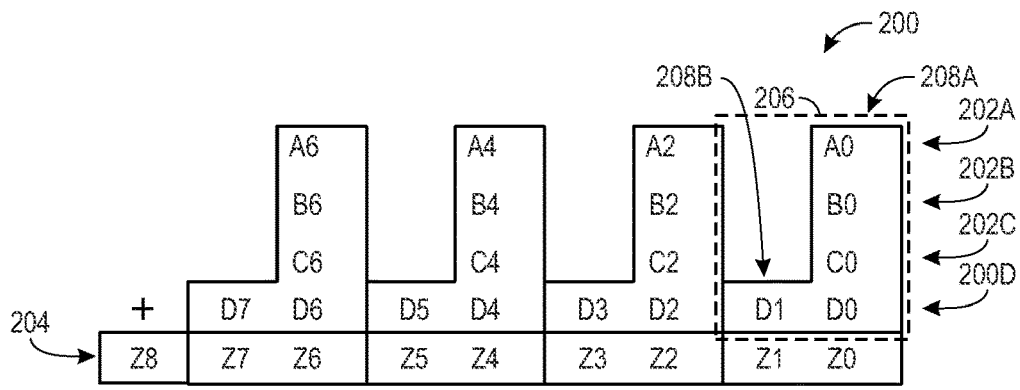
FIG. 7 is a diagram of pentominoes associated with an addition operation, in accordance with an embodiment.

FIG. 7 illustrates a diagram 200 showing the addition of vectors 202A, 202B, 202C, 202D to produce a sum 204. The bits of the vectors 202A, 202B, 202C, 202D (e.g., A0, B0, C0, D0) may be arranged into pentominoes, such as pentomino 206. As illustrated, the pentomino 206 includes columns 208A, 208B of bits in which one column 208A includes four bits (e.g., A0, B0, C0, D0) and another column 208B includes one bit (e.g., D1). Bearing this in mind, circuitry that may be programmed onto the integrated circuit device 12 to add the bits of the pentomino 206 will be discussed.

Figure 8:
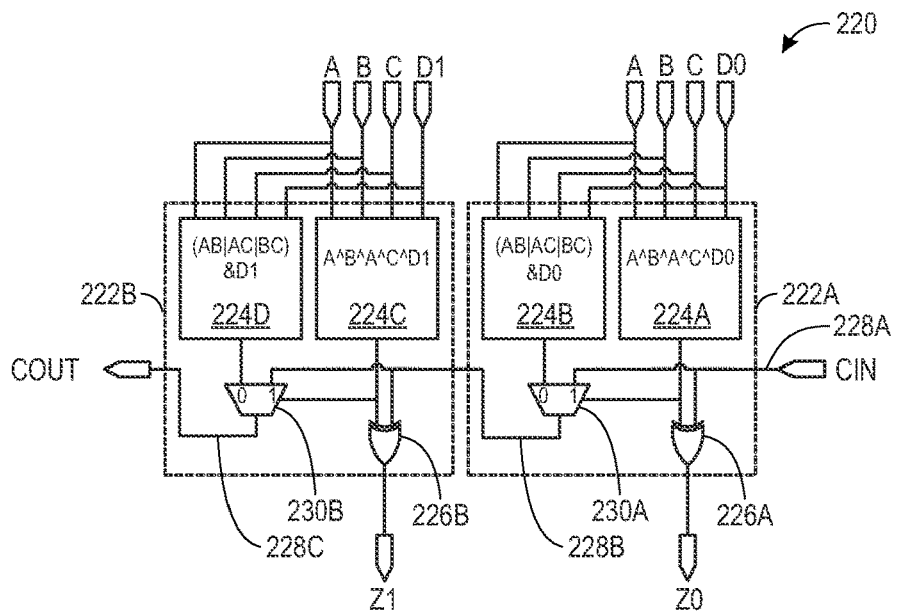
FIG. 8 is a schematic diagram of adder circuitry that may determine a portion of the sum of FIG. 7, in accordance with an embodiment.

FIG. 8 is a schematic diagram of adder circuitry 220 that may be included in the adder 26 of the integrated circuit device 12. In particular, the adder circuitry 220 may be utilized to add the bits of the columns 208 of the pentomino 206. As illustrated, the adder circuitry 220 includes adders 222A, 222B. In particular, the adder 222A may include a LUT 224A that receives four inputs (e.g., bits A, B, C (respectively indicative of A0, B0, C0 of FIG. 5), and D0) and performs logic operations on the received inputs. For example, the LUT 224A may perform several XOR logic operations, such as an XOR logic operation on bits A and B to produce one output and another XOR logic operation on bits C and D to produce another output. The LUT 224A may utilize the outputs as inputs to perform another XOR logic operation that produces an output that may be provided to an XOR gate 226A. The XOR gate 226A may produce an output (e.g., Z0) based on the output of the LUT 224A and a carry-in value (CIN) via carry chain 228A.

As illustrated, the adder 222A also includes LUT 224B. The LUT 224B may also receive four inputs (e.g., bits A, B, C, and D0). The LUT 224B may perform several logic operations on the inputs. For example, the LUT 224B may perform various AND logic operations (e.g., A&B, A&C, B&C) and OR logic operations to the outputs. For example, an OR logic operation may be performed using outputs from the A&B and A&C logic operations as inputs, and an output of such an operation may be used as an input along with an output of a B&C logic operation. An output generated from these logic operations may be used an input in an AND logic operation along with D0 to produce an output that is provided to a multiplexer 230A. The multiplexer 230A may also receive the carry-in value (CIN) and the output of the LUT 224A. Based on the carry-in value and the outputs of the LUTs 224A, 224B, the multiplexer 230A may generate a carry-out signal that is provided to adder 222B via carry chain 228B.

The adder circuitry 220 may also include an adder 222B that includes LUTs 224C, 224D that receive four inputs (e.g., bits A, B, C (respectively indicative of A0, B0, C0 of FIG. 7), and D1) and performs logic operations on the received inputs. More specifically, the LUT 224C may function similarly to the LUT 224A, and the LUT 224D may function similarly to the LUT 224B. In other words, the LUTs 224C, 224D may respectively perform the logic operations discussed above with respect to LUTs 224A, 224B, but the inputs may differ (e.g., receiving either D0 or D1 as an input). Additionally, the LUT 224C may generate an output that is provided to an XOR gate 226B. The XOR gate 226B may also receive a carry-in value (e.g., a carry-out value from the multiplexer 230 received via the carry chain 228B). The LUT 224D may generate an output that is provided to a multiplexer 230B. The multiplexer 230B may also receive a carry-in value (e.g., a carry-out value from the multiplexer 230 received via the carry chain 228B) and the output of the LUT 224C, and, based on these inputs, generate an output. The output of the multiplexer 230B may be carry-out value that can be provided to another adder via a carry chain 228C.

The adder circuitry 220 may include additional adders that are used to determine the sum 204. For example, the carry-out value from the multiplexer 230B may be provided to another adder. In other words, similar to the adders 182 of FIG. 6, adders may be chained together and used to perform addition operations. For example, eight or nine adders may be utilized to determine the sum 204. Utilizing adder circuitry based on counters such as pentominoes may enable more efficient use of the integrated circuit device 12. For example, using adder circuitry based on counters enables adders that are more densely packed within the programmable logic 48 of the integrated circuit device 12, which increases the amount of the programmable logic 48 available for programming (e.g., to perform more addition or another function). Furthermore, using adder circuitry based on counters may reduce the amount of routing circuitry utilized, for example, compared to binary adder trees.

Referring briefly back to FIG. 1, as discussed above, the design software 14 may use the compiler 16 to convert a high-level program (e.g., a high-level design made by a designer) into a lower-level description. The compiler 16 may provide machine-readable instructions representative of the high-level program to a host 18 and the integrated circuit device 12. The host 18 may receive the host program 22 which may be implemented by the kernel programs 20. To implement the host program 22, the host 18 may communicate instructions from the host program 22 to the integrated circuit device 12 via the communications link 24.

The kernel programs 20 and the host 18 may enable configuration of the adder 26 on the integrated circuit device 12. The adder 26 may include circuitry and/or other logic elements and may be configured to implement arithmetic operations, such as addition. Additionally, the adder 26 may include circuitry such as the adder circuitry 120, 180, 220, or a combination thereof. The adder 26 may also include portions of one or more of the adder circuitry 120, 180, 220. For instance, the compiler 16 may convert a high-level program that calls for addition to be performed into a lower-level description that enables the logic (e.g., programmable logic 48) of the integrated circuit device 12 to be programmed in order to execute the addition operations.

Figure 9:
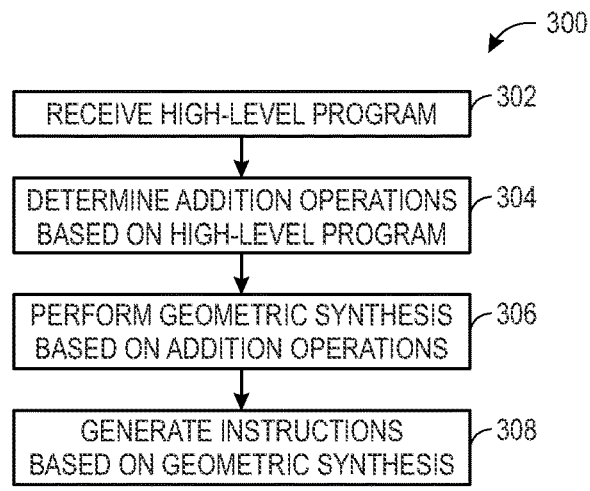
FIG. 9 is a process for performing geometric synthesis, in accordance with an embodiment.

With this in mind, FIG. 9 is a flow diagram of a process 300 for programming the adder 26 onto the integrated circuit device 12. The process 300 may be performed by the compiler 16 or circuitry that may be used to implement the compiler 16. For example, the process 300 may be performing by processing circuitry that executes instructions that, when performed, cause the processing circuitry to perform operations of the compiler 16. The process 300 generally includes receiving a high-level program (process block 302), determining addition operations based on the high-level program (process block 304), performing geometric synthesis based on addition operations (process block 306), and generating instructions based on the geometric synthesis (process block 308).

At process block 302, the compiler 16 may receive a high-level program. For example, as discussed above, the high-level program may be a circuit design that is made by a designer in a high-level programming language. At process block 304, the compiler 16 may determine addition operations based on the high-level program. For example, the compiler 16 may determine that the high-level program calls for one or more sums to be determined.

Figure 10:
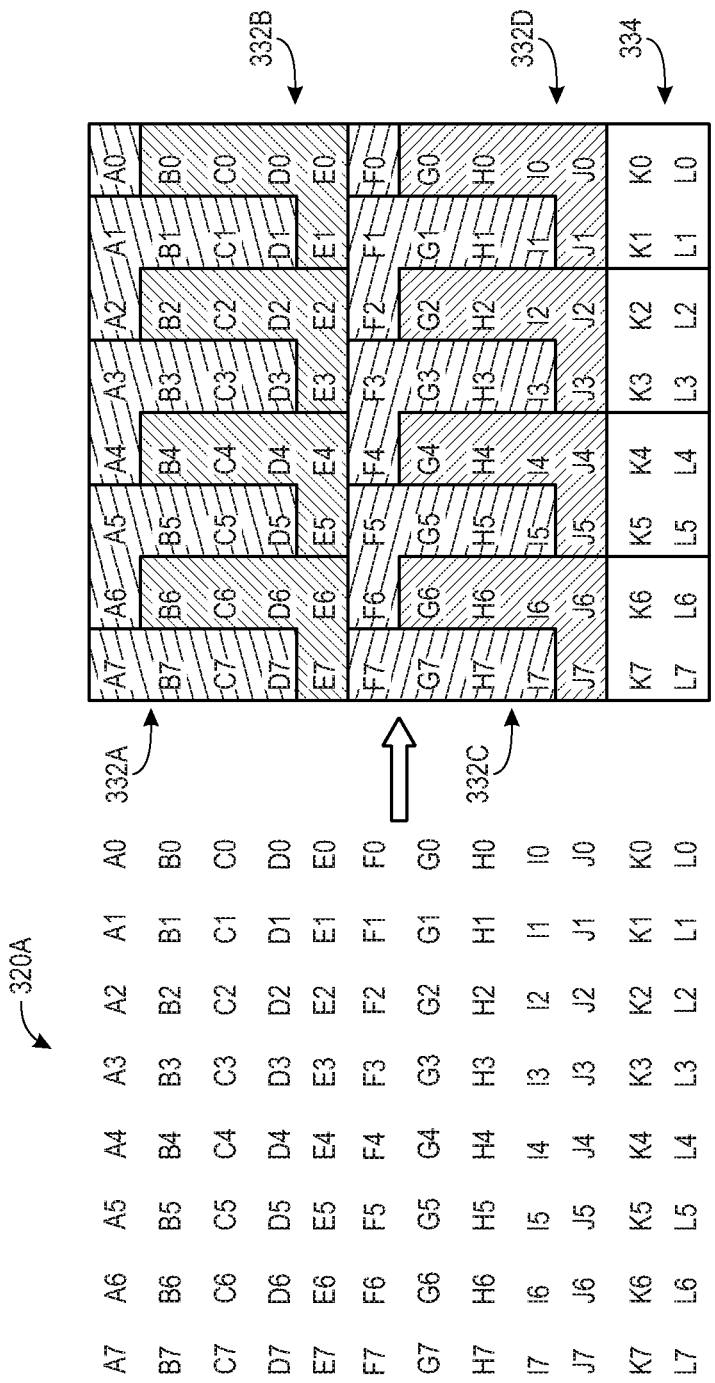
FIG. 10 is a diagram of vectors of bits to be summed, in accordance with an embodiment.
Figure 11:
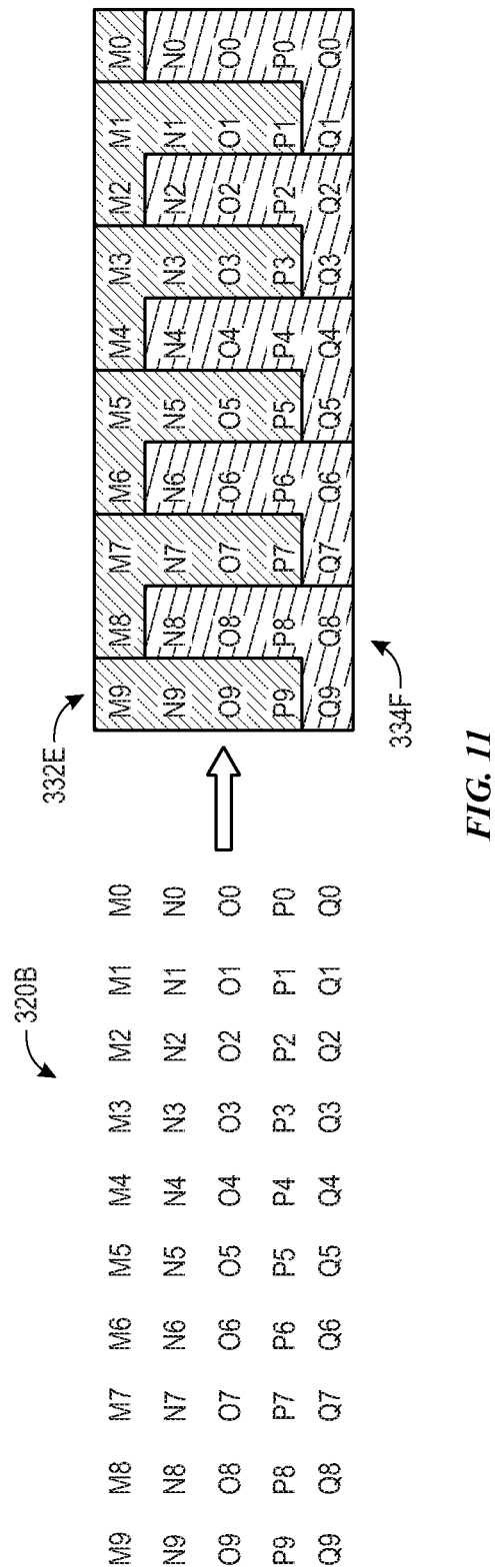
FIG. 11 is a diagram of vectors representing sums associated with the bits of FIG. 10, in accordance with an embodiment.

To help explain, FIG. 10 and FIG. 11 are provided. In particular, FIG. 10 and FIG. 11 illustrate groups 320 of bits to be summed. In particular, each row, which may be indicated by a letter included in the bits of each group 320 (e.g., a-l in group 320A and m-q in group 320B), may be a vector that is to be added to other vectors. The compiler 16 may determine the addition operations by determining which quantities (e.g., vectors) are to be added.

Returning to FIG. 9 and the discussion of the process 300, at process block 306, the compiler 16 may perform geometric synthesis based on the addition operations (e.g., addition operation identified during at process block 304). Performing geometric synthesis generally entails determining counters (e.g., geometric shapes) that correspond to particular circuitry that may be implemented on the integrated circuit device 12. For example, the counters may include one or more tetrominoes, one or more pentominoes, or a combination thereof. Tetrominoes may correspond to adder circuitry 120, and pentominoes may correspond to portions of the adder circuitry 180, the adder circuitry 220, or a combination thereof.

FIG. 10 and FIG. 11 also illustrate the examples of results from performing geometric synthesis. For example, FIG. 10 includes four sets of pentominoes 332A, 332B, 332C, 332D and a set of tetrominoes 334 for twelve vectors each having eight bits. In particular, the sets of pentominoes 332A, 332B, 332C, 332D are interlaced with one another. Each of the sets of pentominoes 332A, 332B, 332C, 332D and the set of tetrominoes 334 may be associated with a sum of a portion of the group 320A of bits. For example, each set of pentominoes 332A, 332B, 332C, 332D may correspond to one adder circuitry 220 that includes adders 222A, 222B that are chained together to determine one sum. Additionally, the set of tetrominoes 334 may correspond to adder circuitry 120 that includes adders 122A, 122B that are chained together to determine one sum. Accordingly, the sets of pentominoes 332A, 332B, 332C, 332D and the set of tetrominoes correspond to five sums (e.g., five vectors), which can be represented by group 320B of FIG. 11.

The compiler 16 may perform further geometric synthesis. For example, the group 320B may be determined to be the resulting set of vectors from adding the vectors of group 320A, and the compiler 16 may perform geometric synthesis on the group 320B of bits. In particular, the group 320B of bits may be reduced as two sets of pentominoes 332E, 332F that interlace with one another. Two sums may be determined for sets of pentominoes 332E, 332F. A sum of the two sums may be determined using a ripple carry adder, such as adder circuitry that includes adders 122A, 122B.

Returning to FIG. 9 and the discussion of the process 300, at process block 308, the compiler 16 may generate instructions based on the geometric synthesis. More specifically, the compiler 16 may generate instructions that may cause the programmable logic 48 of the integrated circuit device 12 to be programmed based on the geometric synthesis. For example, the instructions may be a low-level program describing adder circuitry to be implemented on the integrated circuit device 12, such as adder circuitry associated with tetrominoes, pentominoes, or a combination of tetrominoes and pentominoes.

It should be noted that portions of the process 300 may be performed multiple times during implementation of the process 300. For example, in some embodiments, as part of performing geometric synthesis, or after performing geometric synthesis, the compiler 16 may determine whether a threshold number of sums (e.g., vectors) will be present. For example, the threshold number of sums may be two. When more than two sums will be present, the compiler 16 may determine additional operations. For example, referring briefly to FIG. 10, based on the sets of pentominoes 332A, 332B, 332C, 332D and the set of tetrominoes 334, the compiler 16 may determine that five sums will be determined. The compiler 16 may determine that five sums is greater than the threshold number of sums, determine addition operations to be performed (as represented by five vectors included in group 320B) and then perform additional geometric synthesis (e.g., determine sets of pentominoes 332E, 332F). The compiler 16 may continue to determine additional operations and perform geometric synthesis until the threshold number of sums is obtained, in which case the compiler 16 may perform geometric synthesis again (e.g., for a last time before proceeding to process block 308).

Performing geometric synthesis, and more particularly, utilizing interlaced pentominoes, may provide considerable benefits, such as more efficient utilization of the programmable logic 48 (e.g., denser packing of programmable logic 48) and decreased latency. For instance, in the example of utilizing geometric synthesis as described above with respect to FIG. 10 and FIG. 11, twelve vectors is reduced to five vectors, which can be reduced to two vectors, which can be reduced to a single vector (i.e., the final sum of the twelve initial vectors). In comparison, to compute the same sum using binary reduction tree structures, the group 320A of bits would be reduced to six vectors, which can be reduced to three vectors, which can be reduced to two vectors, which can be reduced to one vector. In other words, more adder circuitry would be utilized, and such adder circuitry would have to perform more rounds of summing data. Furthermore, because more adder circuitry would be utilized, more routing circuitry (e.g., used for carry-out and carry-in values) between components (e.g., adders) of the adder circuitry would be used. Accordingly, programming integrated circuits based on geometric synthesis as described herein may reduce the amount of routing circuitry utilizing, which may reduce latency, thereby improving the speed at which the integrated circuit device 12 may perform arithmetic operations.

It should also be noted that by chaining together adding circuitry that corresponds to counters, carry-out values from between different pieces of adding circuitry. This may be particularly advantageous in programmable logic devices such as FPGAs. For example, performing geometric synthesis as described above may enable particular, specialized hardware on an FPGA to be utilized to perform addition. For example, a number of counters may be selected based on a number of bits hardware utilized to implement the carry chain may support. For example, in a programmable logic device (e.g., FPGA) with twenty bit chains, a group of ten counters that are each two bits "wide," such as the tetromino and pentominoes discussed herein, may be identified. Adding circuitry corresponding the group of counters (e.g., ten pentominoes chained to one another) may be utilized to sum the bits found in the group of counters. Furthermore, because the adding circuitry for each counter is are chained together, the adding circuitry may receive carry-out values from other adders within the adding circuitry and add the carry-out values with other bits. Furthermore, the hardware utilized to implement carry chains (e.g., in an FPGA) may enable the data to be provided between adding circuitry at a low latency. For example, a group of counters may share one single carry chain (e.g., one wire) compared to several multiple wires that may be utilized to implement binary reduction trees.

Figure 12:
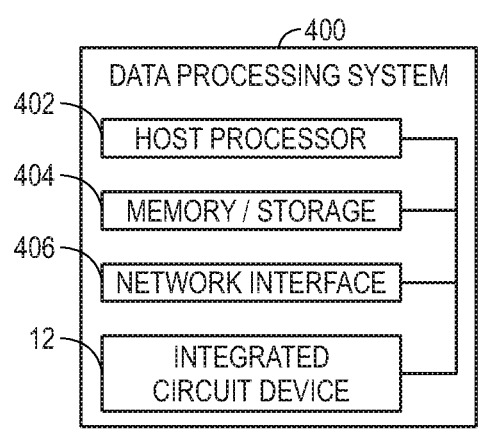
FIG. 12 is a block diagram of a data processing system, in accordance with an embodiment.

With the foregoing in mind, the integrated circuit device 12 may be a part of a data processing system or may be a component of a data processing system that may benefit from use of the techniques discussed herein. For example, the integrated circuit device 12 may be a component of a data processing system 400, shown in FIG. 12. The data processing system 400 includes a host processor 402, memory and/or storage circuitry 404, and a network interface 406. The data processing system 400 may include more or fewer components (e.g., electronic display, user interface structures, application specific integrated circuits (ASICs)).

The host processor 402 may include any suitable processor, such as an INTEL® XEON® processor or a reduced-instruction processor (e.g., a reduced instruction set computer (RISC), an Advanced RISC Machine (ARM) processor) that may manage a data processing request for the data processing system 400 (e.g., to perform machine learning, video processing, voice recognition, image recognition, data compression, database search ranking, bioinformatics, network security pattern identification, spatial navigation, or the like). The memory and/or storage circuitry 404 may include random access memory (RAM), read-only memory (ROM), one or more hard drives, flash memory, or the like. The memory and/or storage circuitry 404 may be considered external memory to the integrated circuit device 12 and may hold data to be processed by the data processing system 400 and/or may be internal to the integrated circuit device 12. In some cases, the memory and/or storage circuitry 404 may also store configuration programs (e.g., bitstream) for programming a programmable fabric of the integrated circuit device 12. The network interface 406 may permit the data processing system 400 to communicate with other electronic devices. The data processing system 400 may include several different packages or may be contained within a single package on a single package substrate.

In one example, the data processing system 400 may be part of a data center that processes a variety of different requests. For instance, the data processing system 400 may receive a data processing request via the network interface 406 to perform machine learning, video processing, voice recognition, image recognition, data compression, database search ranking, bioinformatics, network security pattern identification, spatial navigation, or some other specialized task. The host processor 402 may cause a programmable logic fabric of the integrated circuit device 12 to be programmed with a particular accelerator related to requested task. For instance, the host processor 402 may instruct that configuration data (bitstream) be stored on the memory and/or storage circuitry 404 or cached in sector-aligned memory of the integrated circuit device 12 to be programmed into the programmable logic fabric of the integrated circuit device 12. The configuration data (bitstream) may represent a circuit design for a particular accelerator function relevant to the requested task.

The processes and devices of this disclosure may be incorporated into any suitable circuit. For example, the processes and devices may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), and microprocessors, just to name a few.

Moreover, while the process operations have been described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of overlying operations is performed as desired.

Furthermore, it should be appreciated that logic operations discussed herein (e.g., AND, OR, XOR) are provided as examples circuitry disclosed herein may be implemented. In other embodiments, other logic operations or combinations of logic operations may be utilized. For example, adders and lookup tables discussed above may be modified to produce the same results (e.g., sums).

Additionally, while tetrominoes and pentominoes are discussed herein as counters, it should be noted that counters are not limited to tetrominoes and pentominoes. In other words, the counters may include other geometric shapes or representations that include fewer than four bits or more than five bits. For example, in some embodiments, counters may also include monominoes, dominoes, trominoes, hexominoes, heptominoes, octominoes, nonominoes, and decominoes. Furthermore, counters may be selected while performing geometric synthesis based on the particular data to be added (e.g., bits or vectors of bits) as well as hardware considerations of the integrated circuit device 12.

The embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . " it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. A computer-implemented method for programming an integrated circuit, the method comprising:
   determining a plurality of bits associated with one or more addition operations;
   defining a plurality of counters that includes the plurality of bits, wherein a first counter of the plurality of counters is a pentomino; and
   generating instructions configured to cause circuitry to be implemented on the integrated circuit based on the plurality of counters, wherein the circuitry is configured to perform the one or more addition operations and comprises adder circuitry corresponding to the plurality of counters, wherein each portion of a plurality of portions of the adder circuitry is associated with one counter of the plurality of counters, wherein the plurality of portions of the adder circuitry comprises:
      a first portion of the adder circuitry corresponding to the first counter of the plurality of counters, wherein the first portion of the adder circuitry comprises:
         a first adder configured to:
            determine a first sum of three bits of the pentomino; and
            generate a first carry-out value; and
         a second adder configured to:
            receive the first carry-out value;
            determine a second sum of two bits of the pentomino and the first carry-out value; and
            generate a second carry-out value; and
      a second portion of the adder circuitry corresponding to a second counter of the plurality of counters, wherein the second portion of the adder circuitry is:
         communicatively coupled to the first portion of the adder circuitry via a carry chain;
         configured to receive the second carry-out value via the carry chain; and
         configured to determine a sum of a portion of the plurality of bits and the second carry-out value.

2. The computer-implemented method of claim 1, further comprising:
   receiving a program design; and
   determining the one or more addition operations based on the program design.

3. The computer-implemented method of claim 1, wherein the plurality of counters further comprises a tetromino.

4. The computer-implemented method of claim 1, wherein:
   the plurality of bits correspond to a plurality of vectors; and
   the pentomino comprises five bits from three vectors of the plurality of vectors.

5. The computer-implemented method of claim 1, wherein the plurality of counters comprises interlacing pentominoes.

6. The computer-implemented method of claim 1, wherein the integrated circuit comprises a field programmable gate array (FPGA).

7. The computer-implemented method of claim 1, wherein the first adder and the second adder comprise respective sets of look-up tables.

8. The computer-implemented method of claim 1, wherein the integrated circuit comprises a programmable logic device.

9. A non-transitory computer-readable medium comprising instructions that, when executed, are configured to cause a compiler to:
   receive a program design;
   determine one or more addition operations based on the program design;
   perform geometric synthesis based on the one or more addition operations by:
      determining a plurality of bits of a plurality of vectors associated with the one or more addition operations; and
      defining a plurality of counters that includes the plurality of bits, wherein a first counter of the plurality of counters is a pentomino; and
   generate instructions configured to cause circuitry to be implemented on an integrated circuit based on the plurality of counters, wherein the circuitry is configured to determine a sum of the plurality of vectors by performing the one or more addition operations, wherein the circuitry comprises:
      first adder circuitry corresponding to the first counter of the plurality of counters, wherein the first adder circuitry comprises:
         a first adder configured to:
            determine a first sum of three bits of the pentomino; and
            generate a first carry-out value; and
         a second adder configured to:
            receive the first carry-out value;
            determine a second sum of two bits of the pentomino and the first carry-out value; and
            generate a second carry-out value; and
      second adder circuitry corresponding to a second counter of the plurality of counters, wherein the second adder circuitry is:
         communicatively coupled to the first adder circuitry via a carry chain;
         configured to receive the second carry-out value via the carry chain; and
         configured to determine a sum of a portion of the plurality of bits and the second carry-out value.

10. The non-transitory computer-readable medium of claim 9, wherein the circuitry comprises corresponding adding circuitry for each counter of the plurality of counters.

11. The non-transitory computer-readable medium of claim 9, wherein the plurality of counters further comprises a tetromino.

12. The non-transitory computer-readable medium of claim 9, wherein the instructions are configured to cause the compiler to:
   determine one or more additional addition operations based on the geometric synthesis; and
   perform additional geometric synthesis based on the one or more additional addition operations.

13. The non-transitory computer-readable medium of claim 9, wherein the first adder and the second adder comprise respective sets of look-up tables.

14. The non-transitory computer-readable medium of claim 9, wherein the integrated circuit comprises a programmable logic device.

15. The non-transitory computer-readable medium of claim 9, wherein the plurality of counters comprises interlacing pentominoes.

16. The non-transitory computer-readable medium of claim 14, wherein the programmable logic device comprises a field programmable gate array (FPGA).

17. An integrated circuit comprising:
   adder circuitry configured to determine a sum of a plurality of vectors comprising a plurality of bits, wherein the adder circuitry comprises:

first adder circuitry comprising:
  a first adder configured to:
    determine a first sum of three bits of a pentomino; and
    generate a first carry-out value; and
  a second adder configured to:
    receive the first carry-out value;
    determine a second sum of two bits of the pentomino and the first carry-out value; and
    generate a second carry-out value; and
second adder circuitry communicatively coupled to the first adder circuitry via a carry chain, wherein the second adder circuitry is configured to:
  receive the second carry-out value via the carry chain; and
  determine a third sum of a portion of the plurality of bits and the second carry-out value.

18. The integrated circuit of claim 17, comprising a programmable logic device.

19. The integrated circuit of claim 18, wherein the programmable logic device comprises a field programmable gate array (FPGA).

20. The integrated circuit of claim 17, wherein the first adder and the second adder comprise respective sets of look-up tables.

\* \* \* \* \*